Figure 1:
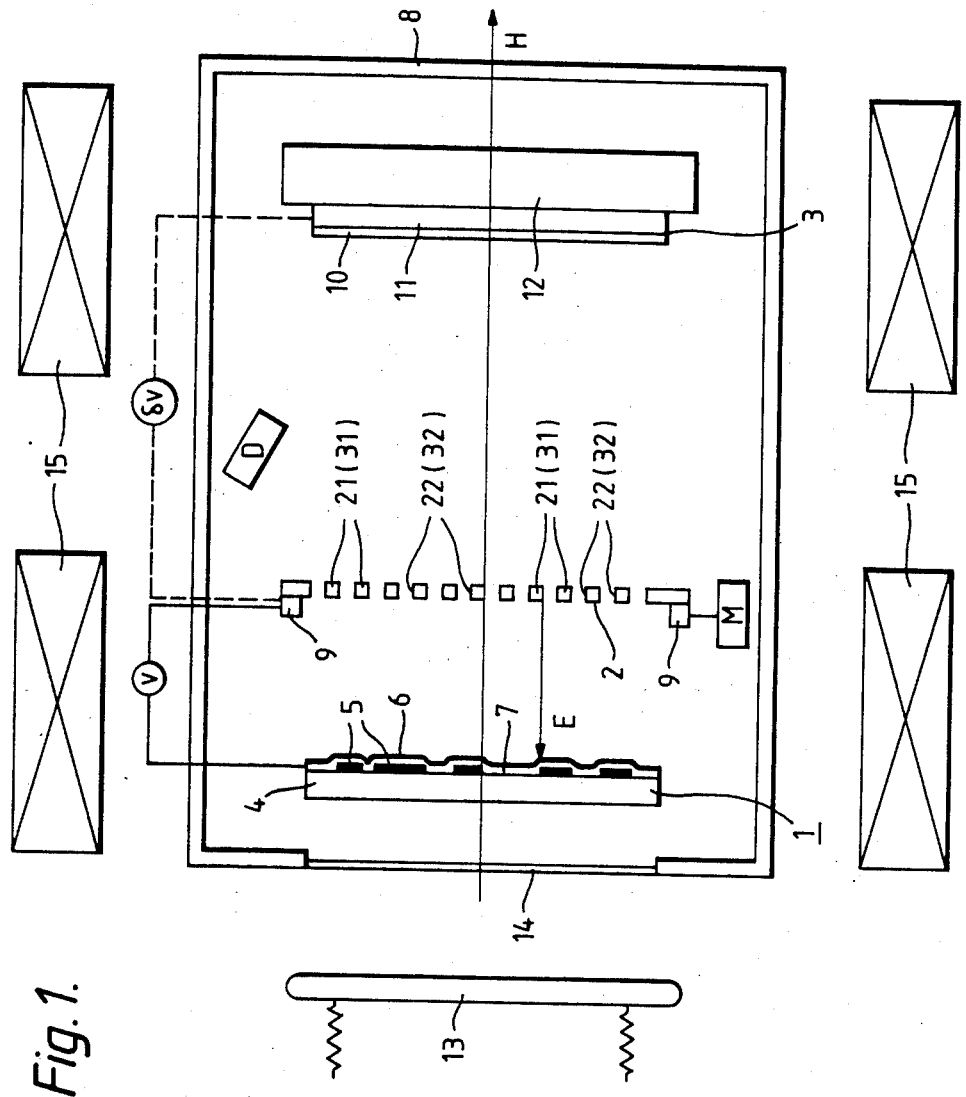

United States Patent [19]

Ward

[11] Patent Number: 4,695,732
[45] Date of Patent: Sep. 22, 1987

[54] ELECTRON LITHOGRAPHY APPARATUS

[75] Inventor: Rodney Ward, Crawley, England

[73] Assignee: U.S. Philips Corporation, New York, N.Y.

[21] Appl. No.: 730,885

[22] Filed: May 6, 1985

[30] Foreign Application Priority Data

May 18, 1984 [GB] United Kingdom ............... 8412698

[51] Int. Cl.⁴ .................... H01J 37/00; H01J 37/30
[52] U.S. Cl. ............................. 250/492.2; 250/505.1
[58] Field of Search ..................... 250/492.2, 505.1

[56] References Cited

U.S. PATENT DOCUMENTS

| | | | |
|---|---|---|---|
| 3,843,916 | 10/1974 | Trotel et al. | 250/492.2 |
| 4,112,307 | 9/1978 | Föll et al. | 250/505.1 |
| 4,370,556 | 1/1983 | Stengl et al. | 250/505.1 |
| 4,550,258 | 10/1985 | Omata | 250/505.1 |
| 4,554,458 | 11/1985 | Behringer et al. | 250/492.2 |

FOREIGN PATENT DOCUMENTS

| | | | |
|---|---|---|---|
| 2700357 | 7/1978 | Fed. Rep. of Germany | 250/492.2 |
| 0132269 | 11/1978 | Japan | 250/492.2 |

*Primary Examiner*—Bruce C. Anderson
*Attorney, Agent, or Firm*—Jack Oisher; Robert T. Mayer

[57] ABSTRACT

An electron image projector for transferring mask patterns onto a semiconductor wafer comprises a patterned photoemissive cathode mask (4) and a target (3) formed by the semiconductor wafer (11) coated with an electron sensitive resist (10). Accelerated by a uniform electric field E and focussed by a uniform magnetic field H a patterned electron beam is projected from the cathode onto the target with unity magnification. The electric field E is established between the cathode and an electron permeable anode grid (2) situated between the cathode and the target. The anode grid comprises a plurality of mutually parallel slats (21,31) spaced apart by elongate electron permeable regions (22,32). The grid may be formed for example by an apertured silicon wafer (see FIG. 2) or conductive sheet, or by metal wires stretched across a metal annulus (see FIG. 3).

7 Claims, 3 Drawing Figures

ELECTRON LITHOGRAPHY APPARATUS

This invention relates to an electron image projector for projecting with substantially unity magnification a beam of electrons emitted by a cathode onto a target under the action of substantially uniform electric and magnetic fields, wherein the beam of electrons has a predetermined spatial pattern which extends transversely to the electric field.

An electron image projector can be used in the manufacture of high resolution microminiature solid state devices, such as semiconductor devices, for defining lithographically a pattern in an electron sensitive resist layer provided on a substrate. The patterned electron beam emitted by the cathode is projected onto the resist layer to define therein a pattern reproducing the pattern of the electron beam. After exposure the resist is developed and the patterned resist layer thus formed is used as a stencil during subsequent processing of the substrate to form the device in question.

Co-pending (as yet unpublished) British Patent Application No. 823769 corresponding to U.S. patent application Ser. No. 645,881 filed Aug. 30, 1984 and its continuation Ser. No. 883,007, filed July 7, 1986, which U.S. applications are assigned to the assignee of this application discloses a novel electron image projector in which the anode comprises a grid having an array of electron permeable regions in a honeycomb-like structure. The grid is disposed between and parallel to the cathode and the target. In operation a uniform electric field is produced between the cathode and the grid and a uniform magnetic field is produced parallel to the electric field to focus the patterned beam of electrons onto the target.

According to the present invention there is provided an electron image projector for projecting with substantially unity magnification a beam of electrons emitted by a cathode onto a target under the action of a substantially uniform electric field wherein the beam of electrons has a predetermined spatial pattern which extends transversely to the electric field, the projector comprising an electron emissive cathode, an anode comprising a grid having a plurality of mutually parallel slats spaced apart by electron permeable regions, each of which regions in the plane of the grid is elongate, the grid being disposed intermediate and parallel to the cathode and the target whereby in operation the electric field is produced between the cathode and the anode grid, the projector further comprising means for producing a substantially uniform magnetic field parallel to the electric field to focus the patterned beam of electrons onto the target.

This electron image projector employs a slatted grid which, compared with the honeycomb-like grids disclosed in the aforementioned patent applications has the advantage that it can be easier to make and is more transparent to electrons. Improved electron transparency is beneficial because the grid is disposed between the cathode and the target. The intensity of the electron beam incident on the target is therefore increased allowing shorter exposure times.

In order to compensate for the shadow effect of the grid slats it is preferable for the electron image projector to comprise means for moving the grid transversely to the direction of motion of the electrons and transversely to the slats. Thus the pattern of the electron beam can be reproduced on the target unimpaired by the configuration of the grid. However, in order to achieve this effect the direction and magnitude of movement is less critical than in the case of the honeycomb-like grid as discussed in more detail below.

Preferably the surface of the grid facing the cathode is disposed substantially in coincidence with a focus of the magnetic field. Thus when the target is also substantially at a magnetic focus any distortion which otherwise may have been introduced by the electric lens effect of the grid is optimally compensated by the magnetic field.

In one particular form the grid may comprise a wafer of semiconductor material such as silicon provided with elongate apertures. A silicon grid has the advantage that it is compatible with silicon device processing and can be manufactured using techniques which are themselves well-established in the semiconductor art.

In an alternative example the grid may comprise an electrically conductive frame having an aperture, the slats being formed by electrically conductive wires which extend over the aperture and which are electrically connected to the frame. This form of grid has the advantage that it is relatively straightforward to manufacture.

Figure 2:
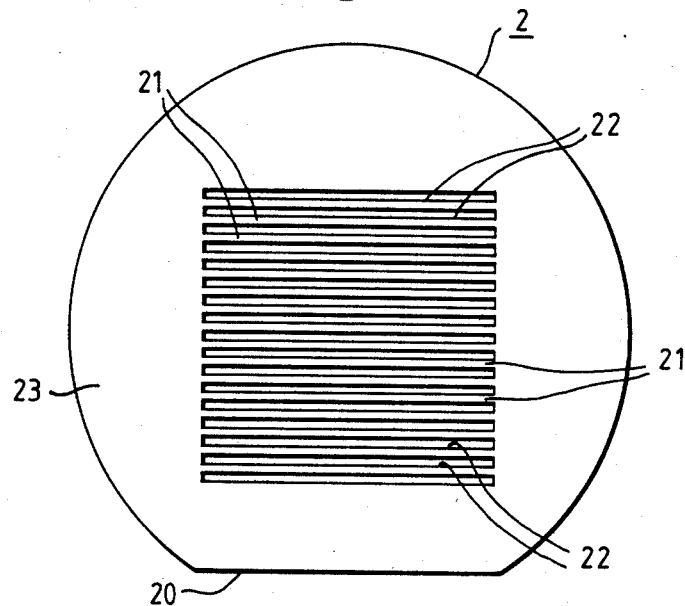
Figure 3:
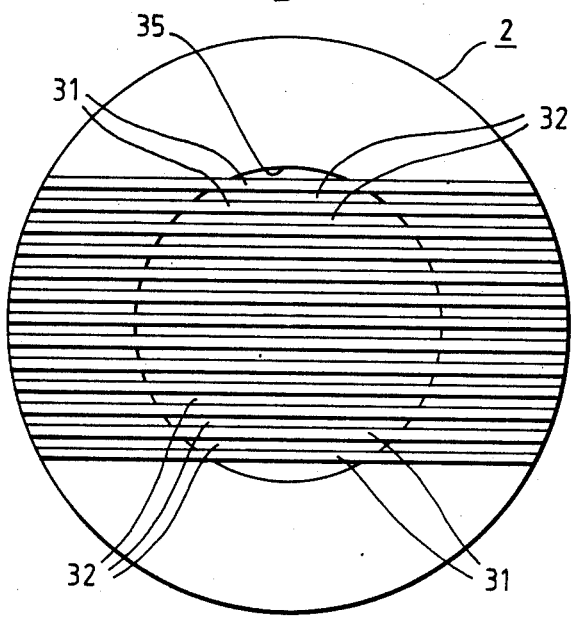

Embodiments of the invention will now be described by way of example with reference to the accompanying drawings, in which:

FIG. 1 is a schematic cross sectional view of an electron image projector in accordance with the invention, FIG. 2 is a plan view of an anode grid for use in the electron image projector of FIG. 1, and FIG. 3 is a plan view of an alternative anode grid for use in the electron image projector of FIG. 1.

It is noted that, for the sake of clarity, elements of the drawing are not to scale.

The electron image projector shown in FIG. 1 comprises a photocathode mask 1 and a target 3 onto which a patterned electron beam can be projected from the photocathode mask 1 under the action of a uniform electric field as described in more detail below. The target 3 is parallel to the photocathode mask 1. A slatted grid 2 is disposed intermediate and with its major surfaces parallel to the photocathode mask 1 and the target 3. The photocathode mask 1, the grid 2, and the target 3 are enclosed within a vacuum chamber 8 in which a low pressure of, for example, $10^{-5}$ Torr, is maintained during operation.

The photocathode mask comprises a circular quartz plate 4 which may be, for example 3 mm thick. A patterned layer 5 of material opaque to ultraviolet radiation, for example a 1000 angstrom thick chromium layer is present on the surface 7 of the plate 4 facing the grid 2. A continuous photoemissive layer 6, for example a layer of 200 angstroms thick, covers the patterned opaque layer and the exposed areas of the surface. In order to avoid charging effects a thin continuous conducting layer, for example a layer of chromium 200 angstroms thick, is provided on the patterned opaque layer 5 and on exposed parts of the plate 4. For the sake of clarity this conducting chromium layer, which is so thin as to be optically transparent, is not shown in FIG. 1.

The slatted grid 2 constitutes an anode to which a potential can be applied for establishing an electric field between the grid 2 and the photocathode mask 1. Specific structures for the grid are discussed in more detail below with reference to FIGS. 2 and 3. Put briefly, the grid 2 comprises a plurality of mutually parallel slats spaced apart by electron permeable regions. Each electron permeable region has an elongate section in the plane of the grid. The grid 2 is moved in its own plane during exposure so that the pattern produced on the target 3 reproduces the pattern of the electron beam without reproducing the configuration of the grid. A suitable mounting which permits the grid to move such that it remains accurately parallel to the cathode 1 and at a constant distance therefrom is described in the copending patent applications mentioned above. The movement of the grid may be effected pneumatically, either from outside the vacuum chamber via bellows or from within the chamber by means M such as one or more Bourdon tubes. It is noted here however that the direction and magnitude of the grid movement is less critical than in the case of the honeycomb-like grid. Thus the only requirement in the present case is to move the grid in its own plane in any direction other than parallel to the slats such that in the direction orthogonal to the slats the grid is moved over a distance equal to an integral multiple of the pitch of the slats. However, for displacements which are large compared with the pitch of the slats the distance moved is less critical.

The target 3 comprises an electron sensitive resist layer 10 present on a semiconductor wafer 11 held by a chuck 12, for example an electrostatic chuck as disclosed in British Pat. No. GB 1,443,215 or European Patent Application No. EP 0,074,691.

An ultraviolet lamp 13 is situated outside the vacuum chamber 8 and is operable to illuminate the surface of the photocathode mask 1 remote from the grid 2. The ultraviolet radiation reaches the photocathode mask via a window 14 in the vacuum chamber.

In operation a large potential difference V of, for example, 20 kV is applied between the photocathode mask 1 and the grid 2 (via ring 9) to establish an electric field E therebetween. Under the action of this electric field E electrons emitted from portions of the photoemissive layer 6 which do not overlie the patterned opaque layer 5 and which therefore are exposed to radiation from the lamp 13 are projected to the anode grid as a beam of electrons having a spatial pattern which extends transversely to the electric field E. The pattern of the electron beam corresponds to the pattern of the photocathode mask 1 determined by those portions of the photoemissive layer 6 where the patterned opaque layer 5 is not present.

A substantially uniform magnetic field H for focussing the patterned electron beam is produced in known manner by air cored solenoids 15 which surround the vacuum chamber so that the magnetic field H is parallel to the electric field E and extends at least in the whole of the region between the photocathode mask 1 and the target 3. The strength of the magnetic field may, for example, be 180 kAm$^{-1}$. The electrons are thus directed generally in mutually parallel straight lines from the photocathode mask 1 towards the target 3.

The spacing between the photocathode mask 1 and the anode grid 2 is selected to be such that the surface of the grid 2 facing the photocathode mask 1 is located substantially in coincidence with the first magnetic focus in relation to the cathode as explained above. A focused electron image is thus formed substantially at the surface of the grid facing the cathode, i.e. in the entrance plane of the grid. It is noted here, however, that it may be preferable for the magnetic field and the entrance plane of the grid not to be exactly coincident, but slightly displaced so that the cathode is very slightly closer to the entrance plane than to the magnetic focus.

Electrons which are able to pass through the apertures or electron-permeable regions of the grid 2 enter the region between the grid 2 and the target 3. Preferably there is no potential difference between the target 3 and the grid 2 so that the resist coated semiconductor wafer is held at the same potential V as the grid 2. However, to correct for small inaccuracies, a small voltage $\delta V$ which is much less than the projecting voltage V, for example a few per cent or less, and not more than about 5% thereof, may be applied between the grid 2 and the target 3 as represented by the broken line in FIG. 1 to ensure that the patterned electron beam is correctly focused in the target plane.

Having passed through the grid 2, the electrons of the beam still under the influence of the magnetic field H continue to travel generally in mutually parallel straight lines substantially at the same velocity at which they enter the grid 2 until they impinge on the resist layer 10 present on the semiconductor wafer 11. The resist coated semiconductor wafer is located at the second magnetic focus in relation the photocathode mask 1. Because of the magnetic field an individual electron will actually follow a helical path about a magnetic field line if it is emitted at an angle other than normally to the photocathode mask 1. Since the distance in the direction parallel to the magnetic field H travelled by the electrons in describing one revolution of a helix under the influence of the magnetic field H is proportional to their velocity, and since the velocity of the electrons between the grid 2 and the target 3 is substantially twice the average of their velocity between the photocathode mask 1 and the grid 2, the spacing of the target 3 from the grid 2 may be substantially twice the spacing of the grid 2 from the photocathode mask 1. With the magnetic and electric field strengths given here, i.e. 180 kAm$^{-1}$ and 20 kV respectively, the spacing may be 7 mm between the photocathode mask 1 and the grid 2, and 14 mm between the grid 2 and the target 3.

By way of explanation it is noted here that the grid 2 can act as an electric lens tending to deflect the electrons passing through it. If unchecked this could cause distortion of the electron image projected onto the target. More precisely, the electric lens effect imparts an additional transverse velocity component to an electron thereby modifying the radius of its helical path. However, with the grid and the target at respective first and second magnetic foci the electron in travelling from the grid to the target will describe a complete revolution of a helix and therefore the net effect is that the electron suffers zero deflection and hence the electron image is projected onto the target 3 substantially without distortion.

In the manufacture of microminiature solid state devices, for example semiconductor devices such as integrated circuits, it is necessary to expose the resist coated wafer several times and on each occasion to a differently patterned electron beam. Between exposures the target is removed from the electron image projector for other processing steps to be carried out. An alignment facility is therefore needed to ensure registration of successive patterns. For this purpose reference markers (not shown in FIG. 1) are provided on the target. These reference markers may be formed from, for example, silicon dioxide bars or may consist of topographical features, particularly pits, formed at the surface of the target. Corresponding reference markers are present on the photocathode mask 1. The location of the reference markers on the target can be ascertained by detecting electrons backscattered therefrom using an electron detector D positioned between the grid 2 and the target 3 outside the region occupied by the electron beam. The output of the detector D can be used to control the alignment of the projected electron beam with the wafer using magnetic deflection is known manner.

There will now be described with reference to FIG. 2 a first example of a slatted grid structure for use in the electron image projector described above.

The grid 2 shown in FIG. 2 is formed from a silicon wafer approximately 300 μm thick. The wafer has a generally circular outline with a conventional flat edge 20. The major surfaces of the wafer are parallel to the (110) planes. The grid has a plurality of mutally parallel silicon slats 21 each approximately 50 μm thick at a pitch of approximately 150 μm. Adjacent slats 21 are spaced apart by electron permeable apertures 22 approximately 100 μm wide. In the plane of the grid the apertures 22 are elongate, their length being substantially greater than their width. The actual length of the apertures 22 (and hence also of the slats 21) and the number employed will depend on the size of the electron beam to be projected, which in turn depends on the size of the pattern on the photocathode mask. Briefly it can be said that the area of the grid occupied by the slats and electron permeable regions should be at least as extensive as the electron beam to be projected. The apertures 22 can be formed by anisotropic etching using, for example 40% KOH in water which preferentially etches parallel to the (111) planes so that with a (110) wafer apertures 22 are cut orthogonally through the wafer. During the etching step a mask provided by conventional photolighographic techniques is present on the wafer surface not only at the area of the slats but also at a peripheral portion of the wafer. In this way the peripheral portion forms a supporting frame 23 integral with the slats 21.

An alternative grid structure will now be described with reference to FIG. 3.

The grid shown in FIG. 3 comprises an annular frame 33 made for example of 5 mm thick titanium. The frame 33 has a circular outline and a centrally located circular aperture 35. In this case the slats are formed by beryllium-copper wires 31 approximately 100 μm in diameter. The wires 31 are stretched over the aperture 35 and are fixed at opposite ends to the frame 33, for example, by potting in epoxy resin or by reflow soldering. In this manner the wires 31 are electrically connected to the frame 33. The pitch of the wires 31 is arranged to be approximately 200 μm so that 100 μm wide gaps 32 are present between adjacent wires 31. These gaps 32 form the elongate electron permeable regions of the grid. In this case the effective area of the grid is determined by the circular aperture 35 in the frame 33. This aperture 35 should be at least as extensive as the electron beam to be projected.

In view of the above description it will be evident to a person skilled in the art that many modifications may be made within the scope of the invention. In particular slatted grid structures may be used which have different constructions or are made of materials other than those described above. For example, instead of using a silicon wafer and providing apertures therein the grid may be formed in a similar manner from a sheet of conducting material such as copper, or insulating material such as polyimide with a conductive coating.

I claim:

1. An electron image projector for projecting with substantially unity magnification a beam of electrons emitted by a cathode onto a target under the action of a substantially uniform electric field wherein the beam of electrons has a predetermined spatial pattern which extends transversely to the electric field, the projector comprising an electron emissive cathode, an anode comprising a grid having a plurality of mutually parallel slats, each pair of parallel slats being spaced apart along their entire lengths by electron permeable regions, the grid being disposed intermediate and parallel to the cathode and the target and the area of slats and regions being large enough that said beam is interrupted over its entire spatial pattern only by said parallel slats, an electric field voltage source, means on said cathode and said grid for connecting said electric field voltage source thereto whereby in operation said uniform electric field is produced between the cathode and the anode grid, the projector further comprising means for producing a substantially uniform magnetic field parallel to the electric field to focus the patterned beam of electrons onto the target.

2. An electron image projector as claimed in claim 1, in which the surface of the grid facing the cathode is disposed substantially in coincidence with a focus of the magnetic field.

3. An electron image projector as claimed in claim 2, comprising means for moving the grid transversely to the direction of motion of the electrons and transversely to the slats.

4. An electron image projector as claimed in any one of the preceding claims, in which the slats of the grid are made of silicon, and the elongate electron permeable regions are apertures between the silicon slats.

5. An electron image projector as claimed in claim 4, in which the silicon slats are integral with a silicon supporting frame.

6. An electron image projector as claimed in claim 5, in which the grid is formed from a silicon wafer whose major surfaces are parallel to the (110) planes, and the interfaces of the slats and the apertures are parallel to the (111) planes.

7. An electron image projector as claimed in any one of claims 1 to 3, in which the grid comprises an electrically conductive frame having an aperture, and the slats are formed by electrically conductive wires which extend over the aperture and which are electrically connected to the frame.

* * * * *